United States Patent
Buvid et al.

(10) Patent No.: US 10,758,938 B2
(45) Date of Patent: Sep. 1, 2020

(54) PRE-TREATING POLYMER TUBING OR HOSE WITH A HYDROPHOBIC COATING TO REDUCE DEPLETION OF CORROSION INHIBITOR

(71) Applicant: International Business Machines Corporation, Armonk, NY (US)

(72) Inventors: Daniel J. Buvid, Rochester, MN (US); Eric J. Campbell, Rochester, MN (US); Tyler Jandt, Rochester, MN (US); Joseph Kuczynski, North Port, FL (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/382,514

(22) Filed: Apr. 12, 2019

(65) Prior Publication Data

US 2019/0232336 A1 Aug. 1, 2019

Related U.S. Application Data

(62) Division of application No. 14/858,948, filed on Sep. 18, 2015, now Pat. No. 10,293,372.

(51) Int. Cl.
*B05D 7/22* (2006.01)
*B05D 5/08* (2006.01)
(Continued)

(52) U.S. Cl.
CPC ............... *B05D 7/22* (2013.01); *B05D 5/08* (2013.01); *C09D 5/086* (2013.01); *C09D 183/04* (2013.01);
(Continued)

(58) Field of Classification Search
CPC .... B05D 7/222; B05D 7/225; B05D 2254/04; C08K 5/54; C08K 5/541; C08K 5/5415; H08K 5/5419
See application file for complete search history.

(56) References Cited

U.S. PATENT DOCUMENTS 6,206,956 B1  3/2001  Muntz et al.
6,314,227 B1  11/2001  Nath
(Continued)

OTHER PUBLICATIONS

"NeverWet(R) Products—Highly Durable and Highly Repellant", White Paper, NeverWet LLC, May 4, 2015, 6 pages.
(Continued)

*Primary Examiner* — William P Fletcher, III
(74) *Attorney, Agent, or Firm* — Matthew J. Bussan

(57) ABSTRACT

An inside surface of a hose for use with liquid-cooled cooling plate assemblies and other applications that contain copper (Cu) components is pre-treated with a hydrophobic coating to reduce depletion of a copper corrosion inhibitor (e.g., benzotriazole (BTA)) dissolved in a liquid coolant (e.g., deionized water) that flows through the hose. Exemplary hydrophobic coatings include, but are not limited to, polydialkylsiloxanes such as polydimethylsiloxanes. In one embodiment, a multilayer hose is immersed in a solution containing hydrophobizing siloxane monomers dissolved in a solvent. The coated multilayer hose is then dried to evaporate the solvent. As the solvent evaporates, the siloxane monomers bind together to form the hydrophobic coating. In some embodiments, one or more hoses each provided with a hydrophobic coating interconnect liquid-coolant cooling system components (e.g., cold plates, headers, manifolds, pumps, reservoirs, and heat exchangers) of a cooling apparatus that removes heat from one or more electronic components.

14 Claims, 6 Drawing Sheets

(51) Int. Cl.
*C09D 183/04* (2006.01)
*C09D 5/08* (2006.01)
*H05K 7/20* (2006.01)
*H01L 23/473* (2006.01)
*C08G 77/16* (2006.01)

(52) U.S. Cl.
CPC ....... *H01L 23/473* (2013.01); *H05K 7/20254* (2013.01); *H05K 7/20272* (2013.01); *H05K 7/20772* (2013.01); *B05D 5/083* (2013.01); *B05D 7/222* (2013.01); *C08G 77/16* (2013.01)

(56) References Cited

U.S. PATENT DOCUMENTS

| | | | |
|---|---|---|---|
| 8,258,206 | B2 | 9/2012 | Kanagasabapathy et al. |
| 8,514,575 | B2 | 8/2013 | Goth et al. |
| 8,747,977 | B2 | 6/2014 | Boday et al. |
| 8,814,473 | B2 | 8/2014 | Hatton et al. |
| 8,919,388 | B2 | 12/2014 | Boday et al. |
| 9,067,821 | B2 | 6/2015 | Bleecher et al. |
| 9,332,673 | B2 | 5/2016 | Boday et al. |
| 2002/0064663 | A1* | 5/2002 | Murphy ............... C03C 17/009 428/447 |
| 2004/0045620 | A1 | 3/2004 | Kranbuehl |
| 2008/0221009 | A1 | 9/2008 | Kanagasabapathy et al. |
| 2009/0213541 | A1 | 8/2009 | Butterbaugh et al. |
| 2009/0220789 | A1* | 9/2009 | DeSimone ............ B82Y 10/00 428/402 |
| 2010/0294669 | A1* | 11/2010 | Abys ..................... C25D 3/02 205/239 |
| 2012/0009396 | A1 | 1/2012 | Sikka et al. |
| 2012/0045954 | A1 | 2/2012 | Bleecher et al. |
| 2012/0063560 | A1 | 3/2012 | Marquino et al. |
| 2012/0118534 | A1 | 5/2012 | Goth et al. |
| 2013/0087207 | A1 | 4/2013 | Hatton et al. |
| 2013/0139309 | A1 | 6/2013 | Bleecher et al. |
| 2014/0076524 | A1 | 3/2014 | Boday et al. |
| 2014/0087134 | A1 | 3/2014 | Gesford et al. |
| 2014/0202573 | A1 | 7/2014 | Boday et al. |
| 2014/0326349 | A1 | 11/2014 | Vouillamoz |
| 2015/0047725 | A1 | 2/2015 | Edwards et al. |
| 2015/0109734 | A1* | 4/2015 | Boday ............... H05K 7/20272 361/699 |
| 2017/0082222 | A1 | 3/2017 | Buvid et al. |

OTHER PUBLICATIONS

Nimittrakoolchai et al., "Deposition of transparent, hydrophobic polydimethylsiloxane—nanocrystalline TiO2 hybrid films on glass substrate", Songklanakarin Journal of Science and Technology, 2010, vol. 32, No. 2, pp. 157-162.

"Silanes—Organofunctional—For Powerful Connections", Wacker Chemie AG, 2013, 20 pages.

"Materials for Oleophobic and Hydrophobic Coatings", Sartomer, 2012, 34 pages.

Arkles, Barry, "Hydrophobicity, Hydrophilicity and Silane Surface Modification," Gelest, Inc., 2011, 84 pages.

Arkles, Barry, "Silane Coupling Agents," Gelest, Inc., 2014, 76 pages.

Relationship between corrosion rate and moisture content, 3 pages, printed from <https://www.researchgate.net/figure/259760963_fig5_Figure-7-Relationship-between-corrosion-rate-and-moisture-content> on Dec. 4, 2017.

Yahaya et al., "Effects of Clay and Moisture Content on Soil—Corrosion Dynamic", Malaysian Journal of Civil Engineering, vol. 23, No. 1, 2011, pp. 24-32.

U.S. Appl. No. 16/382,460, to Daniel J. Buvid et al., entitled "Pre-Treating Polymer Tubing or Hose With a Hydrophobic Coating to Reduce Depletion of Corrosion Inhibitor", filed Sep. 18, 2015, assigned to International Business Machines Corporation.

U.S. Appl. No. 16/382,460, to Daniel J. Buvid et al., entitled "Pre-Treating Polymer Tubing or Hose With a Hydrophobic Coating to Reduce Depletion of Corrosion Inhibitor", filed Apr. 12, 2019, assigned to International Business Machines Corporation.

List of IBM Patents or Patent Applications Treated as Related (Dated Apr. 12, 2019).

* cited by examiner

PRE-TREATING POLYMER TUBING OR HOSE WITH A HYDROPHOBIC COATING TO REDUCE DEPLETION OF CORROSION INHIBITOR

CROSS-REFERENCE TO RELATED APPLICATION

This patent application is a divisional application of U.S. patent application Ser. No. 14/858,948, filed Sep. 18, 2015, entitled "PRE-TREATING POLYMER TUBING OR HOSE WITH A HYDROPHOBIC COATING TO REDUCE DEPLETION OF CORROSION INHIBITOR", now U.S. Pat. No. 10,293,372 B2, which is hereby incorporated herein by reference in its entirety.

BACKGROUND

The present invention relates in general to the field of electronic packaging. More particularly, the present invention relates to a cooling apparatus that removes heat from one or more electronic components using a liquid-cooled cooling plate assembly in fluid communication with one or more hoses each having an inside surface that is pre-treated with a hydrophobic coating to reduce depletion of a corrosion inhibitor dissolved in a liquid coolant that flows through the hose. The present invention also relates to a hose provided with a hydrophobic coating for use with liquid-cooled cooling plate assemblies and other applications, as well as to a method of fabricating such a coated hose.

SUMMARY

According to some embodiments of the present invention, an inside surface of a hose for use with liquid-cooled cooling plate assemblies and other applications that contain copper (Cu) components is pre-treated with a hydrophobic coating to reduce depletion of a copper corrosion inhibitor (e.g., benzotriazole (BTA)) dissolved in a liquid coolant (e.g., deionized water) that flows through the hose. Exemplary hydrophobic coatings include, but are not limited to, polydialkylsiloxanes such as polydimethylsiloxanes. Siloxane is an organosilicon structure and will not absorb BTA. In one embodiment, a multilayer hose is immersed in a hydrophobic coating solution containing hydrophobizing siloxane monomers dissolved in a solvent. The multilayer hose coated with the hydrophobic coating solution is then dried to evaporate the solvent. As the solvent evaporates, the siloxane monomers bind together to form the hydrophobic coating. In some embodiments, one or more hoses each provided with a hydrophobic coating interconnect liquid-coolant cooling system components (e.g., cold plates, headers, manifolds, pumps, reservoirs, and heat exchangers) of a cooling apparatus that removes heat from one or more electronic components.

BRIEF DESCRIPTION OF THE SEVERAL VIEWS OF THE DRAWINGS

Embodiments of the present invention will hereinafter be described in conjunction with the appended drawings, where like designations denote like elements.

DETAILED DESCRIPTION

Figure 1:
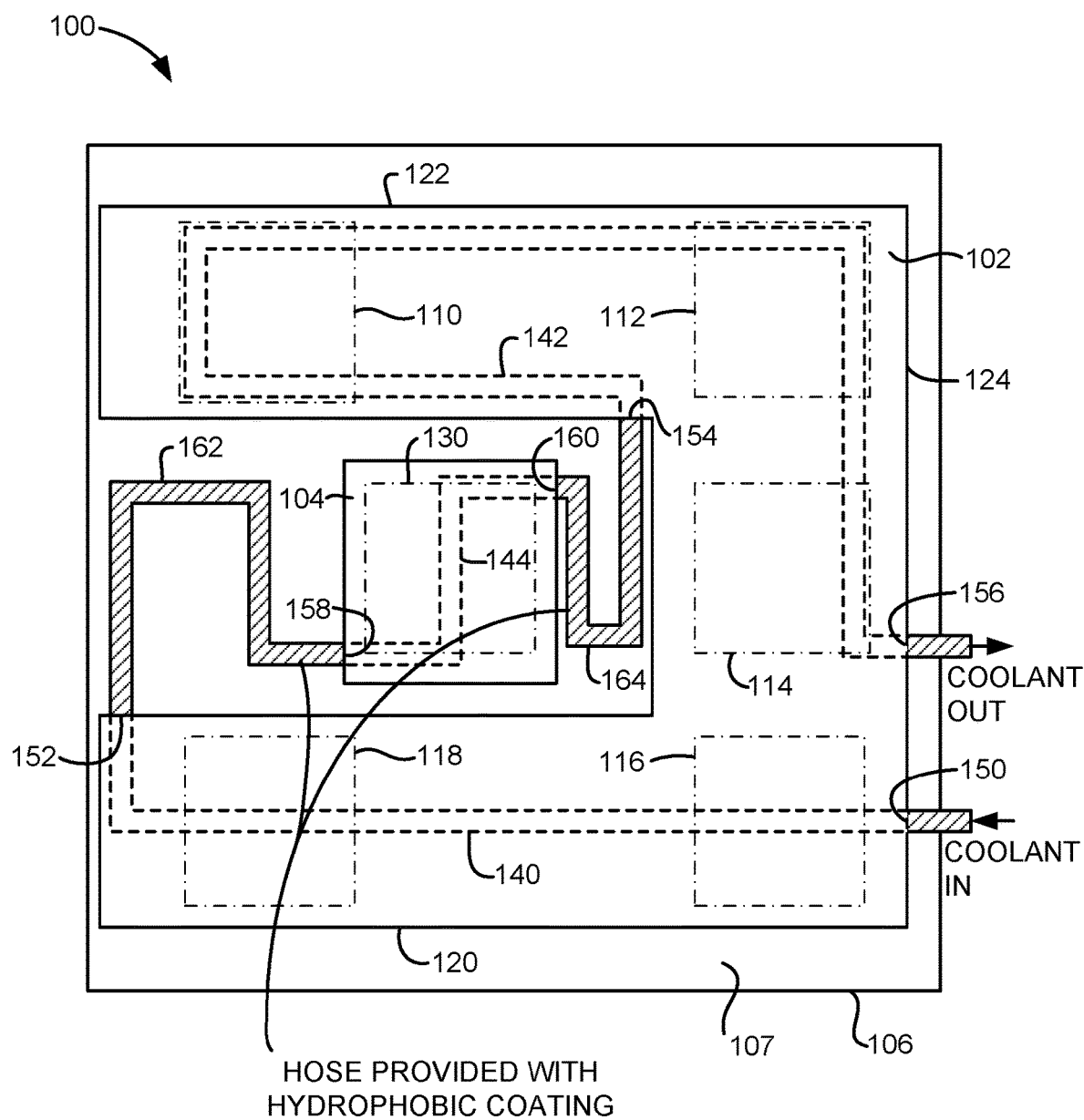
FIG. 1 is a top plan view of a cooling plate assembly having a fixed-gap cooling plate and an articulated cooling plate interconnected with hoses each provided with a hydrophobic coating according to some embodiments of the present invention.

Electronic components, such as microprocessors and integrated circuits, must operate within certain specified temperature ranges to perform efficiently. Excessive temperature degrades electronic component's functional performance, reliability, and life expectancy. Heat sinks are widely used for controlling excessive temperature. Typically, heat sinks are formed with fins, pins or other similar structures to increase the surface area of the heat sink and thereby enhance heat dissipation as air passes over the heat sink. In addition, it is not uncommon for heat sinks to contain high performance structures, such as vapor chambers and/or heat pipes, to enhance heat spreading into the extended area structure. Heat sinks are typically formed of highly conductive metals, such as copper or aluminum. More recently, graphite-based materials have been used for heat sinks because such materials offer several advantages, such as improved thermal conductivity and reduced weight.

High performance computer systems have rapidly migrated toward liquid cooling solutions to effectively remove the massive heat load from the CEC, or central electronics complex. Typically, the CEC of a high performance computer system includes CPUs, RAM and other electronic components that generate copious amounts of heat. Heat is removed from one or more electronic components in the CEC of high performance computer systems using a cooling plate assembly through which a liquid-coolant flows. The design of such systems typically calls for flexible tubing incorporating a large number of connections to one or more liquid-cooled cooling plates (also referred to as "cold plates" and "liquid-cooled heat sinks").

Hence, in an electronic system having a plurality of processor or server nodes, it is not uncommon to include flexible plastic or rubber tubing (also referred to herein as "hose" and "polymer tubing") connected to coolant inlet and outlet fittings of liquid-cooled cold plates and other components in the cooling system such as coolant supply and return headers, coolant supply and return manifolds, coolant pumps, coolant reservoirs, and/or heat exchangers. However, restrictions on the tubing material choice present a challenge to ensure adequate product reliability. Because such designs bring liquid cooling inside nodes, adequate reliability becomes a must to prevent catastrophic failure of electronic components.

The cooling liquid chosen is typically a deionized water solution containing a copper (Cu) corrosion inhibitor to protect the copper components within cooling systems from corroding. Typically, many components in cooling systems are made of copper. Components of cooling systems that may contain copper include, but are not limited to, liquid-cooled cold plates, inlet and outlet fittings, coolant supply and return headers, coolant supply and return manifolds, coolant pumps, coolant reservoirs, and/or heat exchangers. Benzotriazole (BTA) is a common water soluble copper-specific corrosion inhibitor often utilized in cooling systems to protect the copper components from corrosion. Challenges arise though due to depletion of the corrosion inhibitor to other materials, such as hose materials, within the cooling system. This depletion of the corrosion inhibitor dissolved in the cooling liquid ultimately may lead to corrosion of the copper components in the cooling system. That is, removal of the corrosion inhibitor from the cooling liquid leaves the copper components of the cooling system vulnerable to attack.

For example, synthetic hose materials which utilize metal oxides (e.g., oxide fillers) in their formulations interact with the dissolved BTA, causing the BTA to precipitate out onto the inside surface of the hose. Such benzotriazole/synthetic hose interactions may also occur in oxide cured hoses (e.g., at the oxide surfaces of fillers).

The use of a non metal-oxide containing synthetic hose material eliminates interaction between the BTA and the hose, maintaining adequate BTA level in solution to protect copper components in the cooling system. One specific hose formulation that does not cause BTA precipitation is peroxide-cured ethylene propylene diene monomer. A typical formulation of this type would include the following ingredients: EPDM or EPR (ethylene propylene rubber) blend, peroxide, co-agent, oil extender, processing aid, antioxidant/antiozonant, and carbon black. Processing such specialty hoses is substantially more expensive, typically, due to the curing environment needed to produce such specialty hoses.

Alternative corrosion inhibitors, such as polyvinylpyrrolidone (PVP), have been proposed as a replacement for BTA. However, such alternative corrosion inhibitors are typically not as effective as BTA.

In accordance with some embodiments of the present invention, an inside surface of a conventional hose is pre-treated with a hydrophobic coating to reduce depletion of BTA or other corrosion inhibitors dissolved in a liquid coolant. Exemplary hydrophobic coatings include, but are not limited to, polydialkylsiloxanes such as polydimethylsiloxanes, fluoropolymers such as formed from fluorinated acrylate oligomers, and the like. In general, the hydrophobic coating may be any suitable organopolysiloxane or fluoropolymer that presents a hydrophobic surface. By pre-treating a conventional hose, it is possible, in accordance with some embodiments of the present invention, to utilize hose materials that are more cost effective than specialty hoses. For example, it is possible in accordance with some embodiment of the present invention to utilize oxide cured hoses and/or hoses that contain oxide fillers.

Moreover, by pre-treating a conventional hose, it is possible in accordance with some embodiments of the present invention to eliminate the need for a preventative maintenance (PM) schedule in which additional corrosion inhibitor would normally have to be added to the liquid coolant. Additional corrosion inhibitor would not be needed or would be needed less frequently.

Referring now to FIG. 1, there is depicted, in a top plan view, a cooling plate assembly 100 that utilizes one or more hoses 162 and 164 each with a hydrophobic coating in accordance with some embodiments of the present invention. In the embodiment shown in FIG. 1, the coated hoses 162 and 164 interconnect a fixed-gap cooling plate 102 (also referred to herein as a "fixed-gap coldplate") and an articulated cooling plate 104 (also referred to herein as an "articulated coldplate" or a "floating coldplate"). The embodiment shown in FIG. 1 employs a combination of a fixed-gap coldplate and an articulated coldplate. This particular type of cooling plate assembly is shown in FIG. 1 for the purpose of illustrating an exemplary application of the present invention. One skilled in the art will appreciate that a hose provided with a hydrophobic coating in accordance with the present invention may be utilized in other cooling plate assemblies (e.g., a cooling plate assembly employing multiple articulated-gap cold plates) and other applications (e.g., manifold-to-node fluid connect hoses 553 and node-to-manifold fluid connect hoses 551 in a liquid-cooled electronics rack 600, shown in FIGS. 5 and 6).

With the exception of the hoses 162 and 164 each provided with a hydrophobic coating, the cooling plate assembly 100 shown in FIG. 1 is conventional. Specifically, the cooling plate assembly 100 is a modified-version of the cooling plate assembly disclosed in U.S. Patent Application Publication 2009/0213541 A1, published Aug. 27, 2009, entitled "COOLING PLATE ASSEMBLY WITH FIXED AND ARTICULATED INTERFACES, AND METHOD FOR PRODUCING SAME", assigned to the same assignee as the present application, now abandoned, and hereby incorporated herein by reference in its entirety. In the prior art, the flexible tubes used to interconnect the fixed-gap coldplate and the articulated coldplate are typically made of a high thermal conductivity material, such as copper, aluminum, stainless steel, or other metal. Such conventional flexible tubes are each typically fabricated from low modulus metal tubing (e.g., 5-10 mm diameter copper tubing) that is bent to form a free-expansion loop. If made of copper, such conventional flexible tubes would, themselves, be among the copper components that are to be protected from corrosion by the corrosion inhibitor dissolved in the cooling liquid. The free-expansion loop increases the length of the tube and thereby enhances the tube's flexibility as compared to a shorter, more directly routed tube. The free-expansion loop enhances the ability of the tube to accommodate relative movement between the cooling plates (e.g., during attachment of the cooling plates to the printed circuit board) while imparting a relatively low reaction force in response to that relative movement. Typically, brazing is utilized in connecting the conventional flexible tubes to the cooling plates. Unfortunately, the cost of such conventional flexible tubes can be prohibitive in light of the expense of the metal material, the metal bending process used to form the free-expansion loop, and the brazing process used for connection.

The requisite flexibility may also be achieved by reducing the tubing wall strength (e.g., using a polymer tubing material rather than a metal tubing material). The tubing material must generally satisfy four requirements: flexibility (determined as the minimum bend radius prior to kinking), burst strength, flammability, and vapor transmission rate. These requirements often conflict with one another. In particular, the requisite flexibility and burst strength can conflict with one another when using polymer tubing material.

One prior art solution for making flexible tube interconnects possessing the requisite flexibility and burst strength is to use a conventional multilayer extruded hose provided with one or more reinforcement layers. Generally, the reinforcement material is composed of metallic or textile filaments that are converted into a braided, knitted or spiral-type fabric. The addition of one or more reinforcement layers to a conventional multilayer extruded hose improves burst strength.

In accordance with some embodiments of the present invention, an inside surface of a conventional multilayer extruded hose provided with one or more reinforcement layers is pre-treated with a hydrophobic coating to reduce the depletion of BTA or other corrosion inhibitor dissolved in a liquid coolant. Such a multilayer hose provided with a hydrophobic coating is sometimes referred to herein as a "hydrophobic material coated multilayer hose." One skilled in the art will, however, appreciate that other conventional hose constructions (e.g., a conventional single layer extruded hose with or without one or more reinforcement layers or a conventional multilayer extruded hose without any reinforcement layers) may be used in accordance with some embodiments of present invention.

The flexibility of tubing is typically measured as the minimum bend radius prior to kinking. For example, an exemplary hydrophobic material coated multilayer hose having an outside diameter (O.D.) of ¼ inch and a wall thickness of 1/16 inch, may have a flexibility (minimum bend radius) of 1 inch. The burst strength of tubing is typically measured as a maximum working pressure at a given temperature. For example, the exemplary hydrophobic material coated multilayer hose having an outside diameter (O.D.) of ¼ inch and a wall thickness of 1/16 inch, may have a burst strength (maximum working pressure) of 60 PSI at 160° F. The particular parameter values set forth in this example are for purposes of illustration, not limitation.

In the embodiment illustrated in FIG. 1, the fixed-gap cooling plate 102 is "fixedly" mounted to a printed circuit board (PCB) 106 using a relatively thick compliant thermal interface material, while the articulated cooling plate 104 is gimbal-mounted to the PCB 106 using a relatively high performance interface with low thickness and high contact pressure provided by a spring loading mechanism. One or more electronic components to be cooled by the fixed-gap cooling plate 102 is/are mounted on the top surface 107 of the PCB 106, as is one or more electronic components to be cooled by the articulated cooling plate 104.

In the embodiment shown in FIG. 1, the fixed-gap cooling plate 102 provides cooling for electronic components 110, 112, 114, 116 and 118 (shown as phantom lines in FIG. 1), which may be lower power components, such as low power processors, field programmable gate arrays (FPGAs), memory arrays, modules with one or more chips, and the like. In the embodiment shown in FIG. 1, the fixed-gap cooling plate 102 has a generally U-shaped configuration that includes two leg portions 120, 122 each extending from a base portion 124. One skilled in the art will appreciate that the configuration of the fixed-gap cooling plate 102 shown in FIG. 1 is exemplary and that a fixed-gap cooling plate may be configured to have any shape. Likewise, a fixed-gap cooling plate may provide cooling for any number and any type of electronic components. Typically, the electronic components cooled by the fixed-gap cooling plate 102 have relatively low power dissipation as compared to the relatively high power dissipation of the one or more electronic components cooled by the articulated cooling plate 104, i.e., electronic component 130.

The electronic components cooled by the fixed-gap cooling plate 102 are typically in thermal contact with the fixed-gap cooling plate 102 through a compressive pad thermal interface material (TIM) (not shown). The compressive pad TIM may be a re-usable elastomerically conformable type, or it may be pre-cured or, alternatively, may be cured in-situ. For example, the compressive pad TIM may be provided by mixing a multi-part liquid material and then applying the mixture to the fixed-gap cooling plate 102 and/or the electronic components. An example of a suitable composition for the compressive pad TIM is a fiberglass reinforced, thermally conductive silicone gel pad (commercially available from Dow Corning Corporation, Midland, Mich.).

In the embodiment shown in FIG. 1, the articulated cooling plate 104 has a substantially rectangular configuration and is substantially surrounded by the fixed-gap cooling plate 102. That is, the articulated cooling plate 104 is positioned between the leg portions 120, 122 of the fixed-gap cooling plate 102 and adjacent the base portion 124 of the fixed-gap cooling plate 102. One skilled in the art will appreciate that the configuration of the articulated cooling plate 104 is exemplary, as is the positioning of the articulated cooling plate 104 relative to the fixed-gap cooling plate 102, and that an articulated cooling plate may be configured to have any shape and position relative to the fixed-gap cooling plate. The articulated cooling plate 104 typically provides cooling for a high power electronic component 130 (shown as phantom lines in FIG. 1), which is typically a high power processor, a module with one or more high power processor chips, and the like having a relatively high power dissipation. One skilled in the art will appreciate that an articulated cooling plate may provide cooling for any number and any type of electronic components.

In the embodiment shown in FIG. 1, a single coolant channel connects the fixed-gap cooling plate to the articulated cooling plate. In the embodiment shown in FIG. 1, the fixed-gap cooling plate 102 includes thermal dissipation channels 140 and 142, while the articulated cooling plate 104 includes a thermal dissipation channel 144. The thermal dissipation channel 140 extends through a lower-side (as viewed in FIG. 1) of the fixed-gap cooling plate 102 from an inlet port 150 at the base portion 124 to an outlet port 152 at the leg portion 120. The thermal dissipation channel 142 extends through an upper-side (as viewed in FIG. 1) of the fixed-gap cooling plate 102 from an inlet port 154 at the leg portion 122 to an outlet port 156 at the base portion 124. The thermal dissipation channel 144 extends through the articulated cooling plate 104 from an inlet port 158 to an outlet port 160.

In the embodiment shown in FIG. 1, a hydrophobic material coated hose 162 (i.e., a hose provided with a hydrophobic coating) interconnects the outlet port 152 of the thermal dissipation channel 140 of the fixed-gap cooling plate 102 to the inlet port 158 of the thermal dissipation channel 144 of the articulated cooling plate 104. Similarly, a hydrophobic material coated hose 164 (i.e., a hose provided with a hydrophobic coating) interconnects the outlet port 160 of the thermal dissipation channel 144 of the articulated cooling plate 104 to the inlet port 154 of the thermal dissipation channel 142 of the fixed-gap cooling plate 102. In accordance with the some embodiments of the present invention, the hydrophobic material coated hoses 162 and 164 are sufficiently flexible to allow the hoses to be readily routed between and connected to the input and output ports of the cooling plates 102 and 104.

In the embodiment shown in FIG. 1, the hydrophobic material coated hoses 162 and 164 are routed to form a free-expansion loop. The free-expansion loop increases the length of the hose and thereby enhances the hose's flexibility as compared to a shorter, more directly routed hose. The free-expansion loop enhances the ability of the hose to accommodate relative movement between the cooling plates while imparting a relatively low reaction force in response to that relative movement.

The hydrophobic material coated hoses 162 and 164 may have any suitable inside diameter (ID) and outside diameter (OD). For example, the hydrophobic material coated hoses 162 and 164 each may be fabricated to have a standard inside diameter (e.g., ¼ inch, ⅜ inch, etc.).

The hydrophobic material coated hoses 162 and 164 may be connected to the fixed-gap cooling plate 102 and the articulated cooling plate 104 using any suitable conventional fastening technique. For example, conventional barbed insert fittings may be used. Single barb insert fittings, for instance, have a land behind the barb that allows a clamp to be fastened over the hose. In any event, the fastening technique preferably also serves to effectively seal the hoses relative to the cooling plates to prevent coolant leaks.

The single barb insert fitting is an example of a suitable conventional fastening technique that may be utilized in connecting the hydrophobic material coated hoses to the cooling plates. For example, four single barb insert fittings (not shown) may be inserted and sealed into the outlet port 152 of the fixed-gap cooling plate 102, the inlet port 158 of the articulated cooling plate 104, the outlet port 160 of the articulated cooling plate 104, and the inlet port 154 of the fixed-gap cooling plate 102 using conventional techniques. Then, the ends of the hydrophobic material coated hose 162 may be slid over and in turn clamped to (e.g., by tightening a clamp over each end of the hose) two single barb insert fittings respectively provided on the outlet port 152 of the thermal dissipation channel 140 of the fixed-gap cooling plate 102 and the inlet port 158 of the thermal dissipation channel 144 of the articulated cooling plate 104. Similarly, the ends of the hydrophobic material coated hose 164 may be slid over and in turn clamped to (e.g., by tightening a clamp over each end of the tube) two single barb insert fittings respectively provided on the outlet port 160 of the thermal dissipation channel 144 of the articulated cooling plate 104 and the inlet port 154 of the thermal dissipation channel 142 of the fixed-gap cooling plate 102.

Typically, the fixed-gap cooling plate 102 and the articulated cooling plate 104 are made of a high thermal conductivity material, such as copper, aluminum, stainless steel, or other metal. In some embodiments, the fixed-cooling plate 102 and/or the articulated cooling plate 104 may be made of silicon (e.g., single-crystal silicon or polycrystalline silicon) to match the coefficient of thermal expansion of the silicon chips being cooled. In other words, the fixed-gap cooling plate 102 and the articulated cooling plate 104 may or may not be among the copper components that are to be protected from corrosion by the corrosion inhibitor dissolved in the cooling liquid.

The fixed-gap cooling plate 102 and the articulated cooling plate 104 may have a multi-part construction to facilitate the formation of the thermal dissipation channels 140, 142 and 144. For example, each of the cooling plates may be constructed by joining a top plate to a bottom plate, at least one of which has at least a portion of one or more thermal dissipation channels formed on a surface thereof at the interface between top plate and the bottom plate. The top plate and the bottom plate may be joined together using any suitable conventional fastening technique such as brazing, soldering, diffusion bonding, adhesive bonding, etc. For example, the top plate may be bonded to the bottom plate using a silver filled epoxy, filled polymer adhesive, filled thermoplastic or solder, or other thermally conductive bonding material. The fastening technique preferably also serves to effectively seal the plates together to prevent coolant leaks.

The thermal dissipation channels may be formed on the surface of either or both the top plate and the bottom plate by any suitable conventional technique such as routing, sawing or other milling technique, or by etching.

In lieu of a multi-part construction, the fixed-gap cooling plate 102 and/or the articulated cooling plate 104 may have a one-piece construction. For example, the thermal dissipation channels may be formed in the fixed-gap cooling plate 102 and/or the articulated cooling plate 104 through a milling operation (e.g., drilling).

Figure 2:
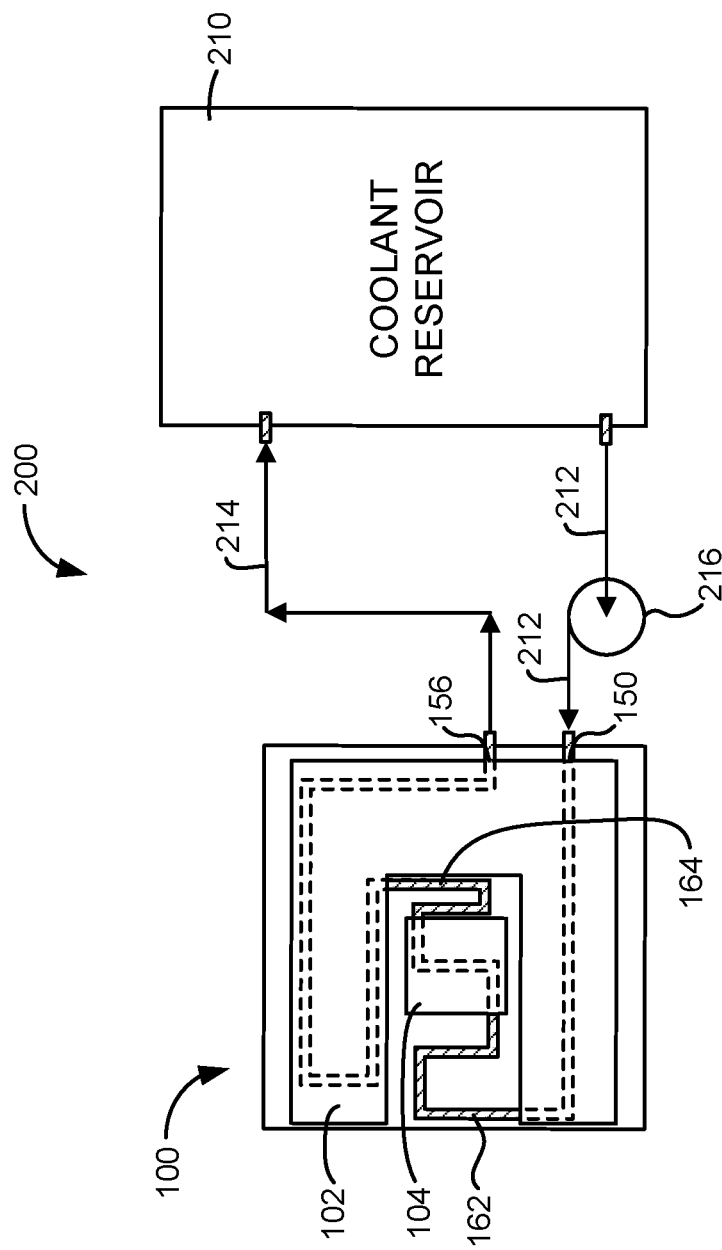
FIG. 2 is a top plan view of a cooling plate assembly of FIG. 1 in fluid communication with a coolant reservoir according to some embodiments of the present invention.

FIG. 2 is a top plan view of a cooling system 200 in which a cooling plate assembly 100 having a fixed-gap cooling plate 102 and an articulated cooling plate 104 interconnected with hydrophobic material coated hoses 162 and 164 and in fluid communication with a reservoir 210 containing cooling fluid according to some embodiments of the present invention. A cooling fluid is preferably pumped from coolant reservoir 210 through a supply conduit 212 to inlet port 150 of the cooling plate assembly 100, where the cooling fluid picks up heat as it travels through thermal dissipation channels of the fixed-gap cooling plate 102 and the articulated cooling plate 104. Then, the cooling fluid is exhausted from outlet port 156 of the cooling plate assembly 100 through an exhaust conduit 214 and returns to thermal reservoir 210. A pump 216 is preferably provided to force the cooling fluid through the recirculation loop. Prior to recirculating the cooling fluid through the recirculation loop, it may be desirable to cool the cooling fluid. For example, the cooling fluid may be cooled in the reservoir or elsewhere using a heat exchanger, waterfall, radiator, or other conventional cooling mechanism. Any of these components may be made of copper and, hence, may be among the copper components of the cooling system 200 that are to be protected from corrosion by the corrosion inhibitor dissolved in the cooling liquid.

The cooling fluid is typically a deionized water solution containing a copper (Cu) corrosion inhibitor to protect the copper components within the cooling system 200 from corroding. Benzotriazole (BTA) is a common water soluble copper specific corrosion inhibitor often utilized in cooling systems to protect the copper components from corrosion. One skilled in the art will, however, appreciate that other suitable coolants and other suitable corrosion inhibitors may be in lieu of, or in addition to, deionized water and BTA. Other suitable coolants include, but are not limited to, water, ethylene glycol, ethylene glycol/water mixture, inert perfluorocarbon fluids (e.g., 3M Fluorinert™ commercially available from 3M Company, St. Paul, Minn.), polyalphaolefin (PAO), ammonia, methanol, nitrogen, and the like. Other suitable corrosion inhibitors include, but are not limited to, methylbenzotriazole (TTA), 2-Mercaptobenzothiazole (MBT), polyvinylpyrrolidone (PVP), and the like.

Supply conduit 212 and exhaust conduit 214 are respectively attached to inlet port 150 and outlet port 156 of the cooling plates assembly 100 using any suitable conventional fastening technique, such as by inserting and sealing tubular fittings into inlet port 150 and outlet port 156, and then mating supply conduit 212 and exhaust conduit 214 over the tubular fittings to provide a tight seal. Supply conduit 212 and exhaust conduit 214 may be rubber, metal or some other suitable material that is compatible with the coolant. The supply conduit 212 and/or the exhaust conduit 214 may be hydrophobic material coated hoses in accordance with some embodiments of the present invention.

In general, the rate of heat transfer can be controlled by using various thermal transport media in the internal structure of the cooling plate assembly 100. For example, the rate of heat transfer can be controlled by varying the composition and/or the flow rate of the cooling fluid. Also, the rate of heat transfer is a function of the configuration of the thermal dissipation channels within the cooling plate assembly 100.

Figure 3:
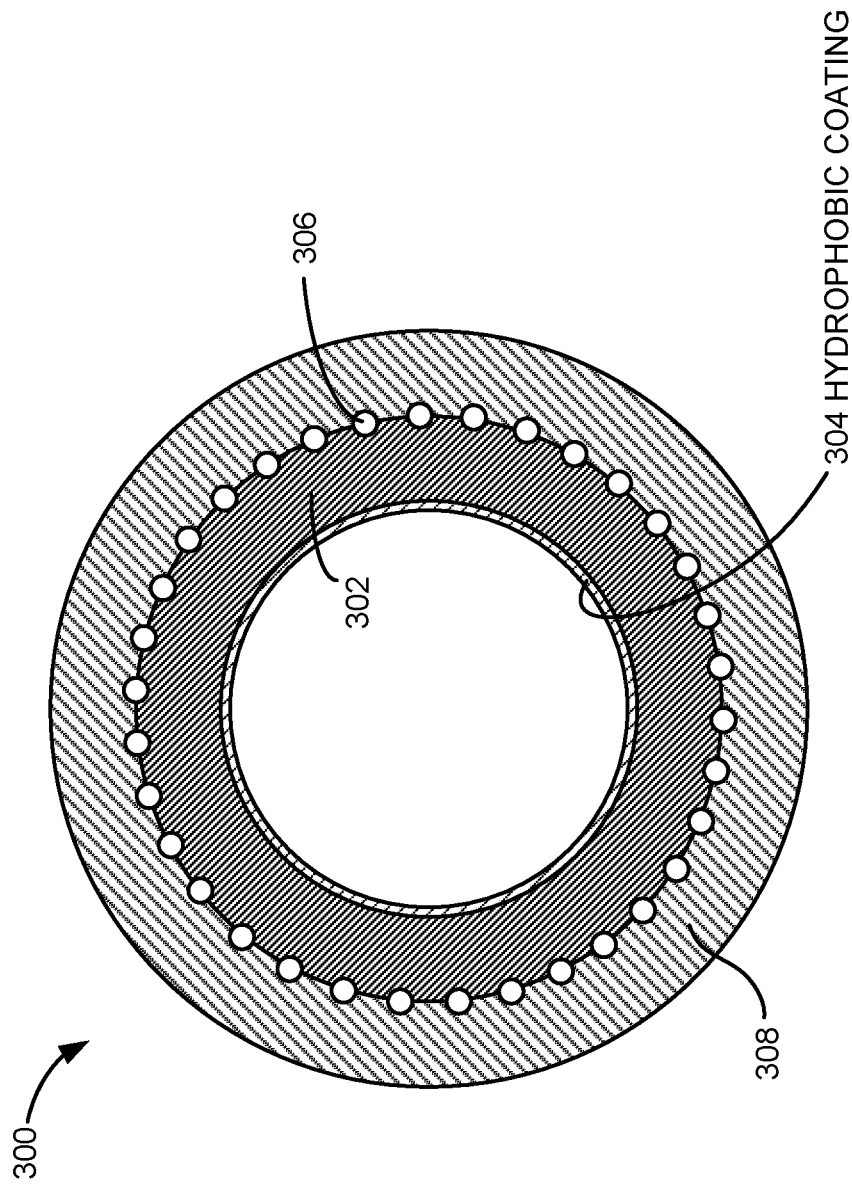
FIG. 3 is cross-sectional view of a multilayer hose provided with a hydrophobic coating according to some embodiments of the present invention.

FIG. 3 is cross-sectional view of a hydrophobic material coated multilayer hose 300 in accordance with some embodiments of the present invention. The hydrophobic material coated multilayer hose 300 shown in FIG. 3 may correspond to one or more of the hydrophobic material coated hoses 162 and 164 shown in FIGS. 1 and 2, as well as one or more of the hydrophobic material coated hoses 551 and 553 shown in FIGS. 5 and 6. In the embodiment illustrated in FIG. 3, the hydrophobic material coated multilayer hose 300 includes an inner layer 302 having an inside surface that is pre-treated with a hydrophobic coating 304, a reinforcement layer 306, and an outer layer 308.

A method of producing the hydrophobic material coated multilayer hose 300 shown in FIG. 3 is described in detail below with reference to FIG. 4. However, a brief overview of a method of producing the hydrophobic material coated multilayer hose 300 is provided at this point to aid in understanding certain structural characteristics of the hydrophobic material coated multilayer hose 300. Initially, a conventional multilayer hose (i.e., the assembly of the inner layer 302/reinforcement layer 306/outer layer 308 in the embodiment shown in FIG. 3) is provided. Next, the conventional multilayer hose is immersed in a hydrophobic coating solution containing hydrophobizing siloxane monomers dissolved in a solvent. The multilayer hose coated with the hydrophobic coating solution is then dried to evaporate the solvent. As the solvent evaporates, the siloxane monomers bind together to form the hydrophobic coating (i.e., the hydrophobic coating 304 in the embodiment shown in FIG. 3) that substantially reduces or eliminates interaction between a corrosion inhibitor (e.g., BTA) and the hydrophobic material coated multilayer hose. Exemplary hydrophobic coatings include, but are not limited to, polydialkylsiloxanes, such as polydimethylsiloxanes. Siloxane is an organosilicon structure and will not absorb BTA.

Examples of suitable hydrophobizing siloxane monomers for forming polydimethylsiloxane hydrophobic coatings in accordance with some embodiments of the present invention include, but are not limited to, hydroxyl-terminated polydimethylsiloxane (PDMS), trimethylsilyl end capped siloxane polymer (available from Wacker Chemie AG), aminofunctional siloxanes (available from Dow Corning), and combinations thereof. The hydrophobizing siloxane monomers may also carry $C_{1-8}$ alkoxy groups, preferably methoxy and ethoxy groups. The hydrophobizing siloxane monomers may be terminated with conventional end groups, such as trialkylsilyl, dialkylsilanolyl, dialkylalkoxysilyl, alkyldialkoxysilyl, dialkylvinylsilyl, and the like. This list of hydrophobizing siloxane monomers is illustrative and not limiting.

Conventional hoses typically contain oxide surfaces, e.g., hoses may be oxide cured and/or contain oxide fillers. In order to prevent the oxide surfaces within the hose from absorbing the corrosion inhibitor, the inside surface of the hose is pre-treated with the hydrophobic coating in accordance with some embodiments of the present invention. This protective coating prevents or substantially reduces the depletion of the corrosion inhibitor dissolved within the cooling liquid of a cooling system. The hydrophobic coating binds to oxide surfaces within the hose thereby preventing absorption of the corrosion inhibitor. The hydrophobic coating may include single molecules and/or macromolecules (polymers). An advantage of using polymers versus single molecules is that polymers typically contain more sites at which the polymer may bind to oxide surfaces. The molecules/macromolecules may, for example, be dissolved in a solution of deionized water that would then be passed through the hose. Upon passing through the hose, the molecules/macromolecules would absorb to the oxide surface irreversibly. Below are examples of suitable hydrophobic coatings.

Polydimethylsiloxane Hydrophobic Coatings:

An example of a suitable hydrophobizing siloxane monomer for forming polydimethylsiloxane hydrophobic coatings is hydroxyl-terminated polydimethylsiloxane (PDMS). Hydroxyl-terminated PDMS binds to oxide surfaces very well, and hence adheres strongly to the oxide surfaces of the hose, e.g., the hose may be oxide cured and/or contain oxide fillers. Moreover, as the solvent evaporates, the terminal hydroxyl groups of the hydroxyl-terminated PDMS are available to participate in a condensation reaction with each other to form the hydrophobic coating.

In a prophetic example, hydroxyl-terminated PDMS (CAS Number 70131-67-8) is dissolved in acetone (to just below saturation) to form a hydrophobic coating solution, into which the hose is then immersed. For example, the hose may be immersed into the solution at room temperature. It may be desirable, however, to immerse the hose into the solution at an elevated temperature (e.g., typically, less than 50° C.). The hose is then withdrawn slowly (e.g., 1-10 mm/sec) from the solution and dried in an oven (e.g., at 60° C. overnight) to evaporate the solvent and form the hydrophobic coating. The rate at which the hose is withdrawn from the solution, in accordance with some embodiments of the present invention, may be empirically determined to result in a coating thickness suitable to prevent BTA adsorption (e.g., 1-5 mils). One skilled in the art will appreciate that any suitable solvent may be used in the solution in lieu of, or in addition to, acetone. Suitable solvents include, but are not limited to, acetone, 1-propanol, toluene, xylene, methyl ethyl ketone (MEK), methyl isobutyl ketone (MIBK), tetrahydrofuran (THF), methanol, and combinations thereof.

Fluoropolymer Hydrophobic Coatings:

In other embodiments, a wide variety of fluoropolymer compositions may be used in the preparation of the hydrophobic coating. Fluoropolymers are polymers comprising one or more fluoroalkyl groups. In some embodiments, the fluoropolymers employed in the hydrophobic coating may be formed from fluorinated acrylate oligomers such as those available under the tradenames CN4001, CN4002 and CN4003 (Sartomer Americas, Exton, Pa.). Optionally, one or more such fluorinated acrylate oligomers may be combined with one or more compatible acrylate monomers, such as hexanediol diacrylate (HDDA) (Sartomer Americas). In other embodiments, the fluoropolymers employed in the hydrophobic coating may be formed from fluoroethylene/vinyl ether (FEVE) copolymers such as those sold under the tradename LUMIFLON (Asahi Glass Company, Ltd., Tokyo, Japan). Typically, fluoroethylene/vinyl ether copolymers come as a two or three component system, as is the case with LUMIFLON products.

In a prophetic example, a hydrophobic coating solution is formed by mixing 58 parts of LUMIFLON LF-200, 6.5 parts of DESMODUR N3300A (Bayer Material Sciences, Levekusen Germany), 2.5 parts of catalyst, and 33 parts xylene. The catalyst is formed by mixing 1/10,000 part DABCO T12 (Air Products & Chemicals Inc., Allentown, Pa.), 1/10,000 part 1,4-diazabicyclo[2.2.2]octane (Air Products & Chemicals Inc.), and 1 part xylene. The hose is then immersed in the hydrophobic coating solution. For example, the hose may be immersed into the solution at room temperature. It may be desirable, however, to immerse the hose into the solution at an elevated temperature (e.g., typically, less than 50° C.). The hose is then withdrawn slowly (e.g., 1-10 mm/sec) from the solution and dried in an oven (e.g., at 60° C. overnight) to evaporate the solvent and form the hydrophobic coating. The rate at which the hose is withdrawn from the solution, in accordance with some embodiments of the present invention, may be empirically determined to result in a coating thickness suitable to prevent BTA adsorption (e.g., 1-5 mils). One skilled in the art will appreciate that any suitable solvent may be used in the solution in lieu of, or in addition to, xylene.

Alternatively, in each of the prophetic examples, in lieu of dip coating the hose, the hydrophobic coating solution may be flowed through the hose. In accordance with some embodiments of the present invention, the solution is passed through the hose itself (i.e., prior to the hose being installed in the cooling system). For example, the solution may be passed through the hose at room temperature. It may be desirable, however, to pass the solution through the hose at an elevated temperature (e.g., typically, less than 50° C.). The hose is then dried in an oven (e.g., at 60° C. overnight) to evaporate the solvent and form the hydrophobic coating.

The conventional multilayer hose may be, for example, a conventional multilayer extruded hose provided with one or more reinforcement layers. One skilled in the art will, however, appreciate that any suitable type of conventional multilayer or single layer hose may be used in lieu of a conventional reinforced multilayer extruded hose. A myriad of suitable conventional multilayer and single layer hoses are commercially available.

Typically, a conventional multilayer extruded hose with a single reinforcement layer is produced using the following process. Initially, the inner layer 302 is extruded onto a mandrel and partially cured. A reinforcement layer 306 is then formed by braiding, knitting, or spirally winding one or more textile filaments on top of the inner layer 302. Then, the outer layer 308 is extruded on top of the assembly of the inner layer 302/reinforcement layer 306 to form a multilayer hose. Finally, the multilayer hose (i.e., the assembly of the inner layer 302/reinforcement layer 306/outer layer 308) is cured.

In the embodiment shown in FIG. 3, the inner layer 302 and the outer layer 308 are each made of ethylene propylene diene monomer (M-class) (EPDM) rubber. In the acronym "EPDM", the "E" refers to ethylene, the "P" refers to propylene, the "D" refers to diene, and the "M" refers to this rubber's classification in ASTM standard D-1418. The M-class includes rubbers having a saturated chain of the polymethylene type. EPDM rubber is an industry standard material for making flexible multilayer extruded hose. However, one skilled in the art will appreciate that other materials may be used in lieu of EPDM rubber to fabricate the inner layer 302 and/or the outer layer 308 in accordance with the present invention and that this embodiment is not limiting.

Moreover, the composition of the inner layer 302 need not be the same as the composition of the outer layer 308. In general, concepts of the present invention are broadly applicable to any multilayer or single layer hose construction. Suitable compositions for the inner layer 302 and/or the outer layer 308 include, but are not limited to, EPDM, nitrile butadiene rubber (NBR), styrene-butadiene rubber (SBR), fluorinated polymers (e.g., fluorinated ethylene propylene (FEP)), and plasticized PVC (e.g., plasticized PVC tubing with the tradename Tygon® is available from Saint-Gobain Performance Plastics Corporation).

The inner layer 302 and the outer layer 308 are fabricated using conventional procedures well known to those skilled in the art. For example, the inner layer 302 and the outer layer 308 may be extruded using conventional extrusion processes. Such conventional extrusion processes are typically used in the production of conventional fabric-reinforced hoses. The inner layer 302 may be, for example, extruded onto a mandrel using a conventional extruder with a straight die and a diameter measuring device. A straight die is a conventional extrusion die for hose production. The outer layer 308 may be, for example, extruded onto the assembly of the inner layer 302/reinforcement layer 306 using a conventional extruder with a vacuum zone, a crosshead die, and a diameter measuring device. A crosshead die is a conventional extrusion die for hose sheathing.

In the embodiment shown in FIG. 3, the reinforcement layer 306 is disposed between the inner layer 302 and the outer layer 308. However, one skilled in the art will appreciate that the one or more reinforcement layers may be disposed at any suitable location within the multilayer hose. The reinforcement layer 306 is fabricated using conventional procedures well known to those skilled in the art. For example, the reinforcement layer 306 may be formed by braiding, knitting, or spirally winding one or more metallic or textile filaments on top of the inner layer 302. Such conventional procedures are typically used in the production of conventional fabric-reinforced hoses. For example, the reinforcement layer 306 may be applied using a conventional braiding machine, a conventional knitting machine, or a conventional spiraling machine. Any suitable conventional textile or metallic filament may be used in the construction of the reinforcement layer 306. Suitable conventional textile filaments include, but are not limited to, nylons (e.g., nylon 6,6; nylon 6,10; and nylon 12,12), polyethylene terephthalate (PET), rayon, and the like. Suitable conventional metallic filaments include, but are not limited to, braided steel fabric.

The hydrophobic material coated multilayer hose 300 shown in FIG. 3 may have any suitable inside diameter (ID) and outside diameter (OD). For example, the hydrophobic material coated multilayer hose 300 may be fabricated to have a standard inside diameter. That is, the hydrophobic material coated multilayer hose 300 may be fabricated as 1/4-inch hose, 3/8-inch hose, 3/4-inch hose, 1-inch hose, etc. Generally, the inner layer 302, the reinforcement layer 306, and the outer layer 308 of the multilayer hose 300 may have any suitable thickness so long as all requisite hose specifications (e.g., ID, OD, minimum wall thickness (MWT), etc.) are met.

Figure 4:
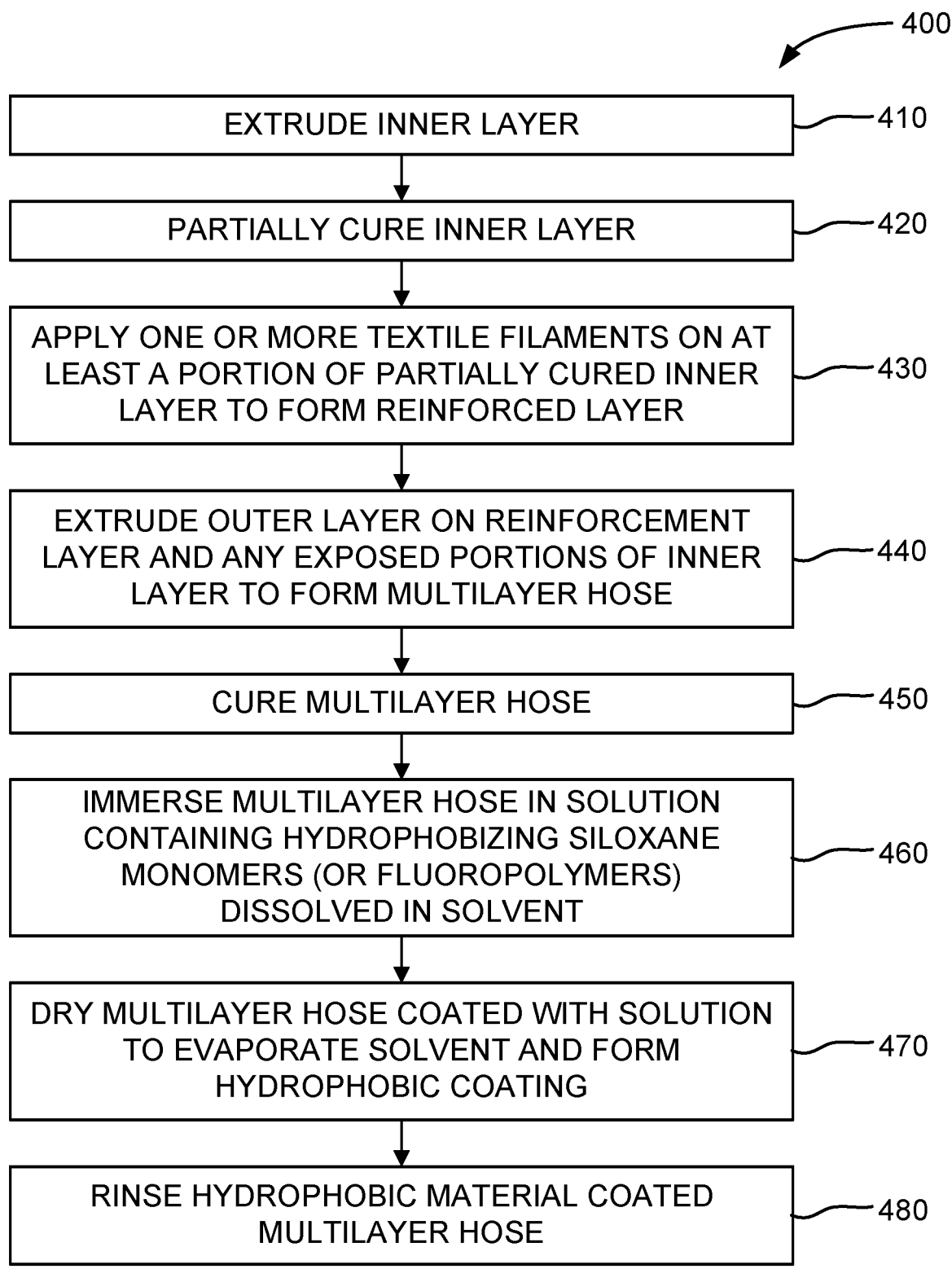
FIG. 4 is a flow diagram of a method of producing a multilayer hose provided with a hydrophobic coating according to some embodiments of the present invention.

FIG. 4 is a flow diagram of a method 400 for producing a hydrophobic material coated multilayer hose in accordance with some embodiments of the present invention. The method 400 sets forth the preferred order of the steps. It must be understood, however, that the various steps may occur at any time relative to one another. The method 400 begins by extruding an EPDM rubber inner layer onto a mandrel (step 410). This step is conventional. Such conventional extrusion processes are typically used in the production of conventional fabric-reinforced hoses. The inner layer 302 (shown in FIG. 3) may be, for example, extruded onto a mandrel using a conventional extruder with a straight die and a diameter measuring device.

The method 400 continues by partially curing the EPDM rubber inner layer (step 420). The inner layer 302 may be partially cured by, for example, heating the inner layer 302 to a curing temperature for a period of time sufficient to only partially cure the inner layer 302.

The method 400 continues by applying one or more textile filaments on top of at least a portion of an outside surface of the partially cured EPDM rubber inner layer to form a reinforcement layer (step 430). This step uses conventional procedures. In the production of conventional fabric-reinforced hoses, for example, textile filaments are braided, knitted, or spirally wound onto the partially cured inner layer. The reinforcement layer 306 (shown in FIG. 3) may be formed by, for example, using a conventional braiding machine, a conventional knitting machine, or a conventional spiraling machine to braid, knit, or spirally wind one or more textile filaments (e.g., nylon 6,6) on top of the inner layer 302.

The method 400 continues by extruding an EPDM rubber outer layer onto the reinforcement layer and any exposed portions of the inner layer to form a multilayer hose (step 440). This step uses conventional extrusion processes. Such conventional extrusion processes are typically used in the production of conventional fabric-reinforced hoses. The outer layer 308 (shown in FIG. 3) may be, for example, extruded onto the assembly of the inner layer 302/reinforcement layer 306 using a conventional extruder with a vacuum zone, a crosshead die, and a diameter measuring device.

The method 400 continues by curing the multilayer hose (step 450). The multilayer hose (i.e., the assembly of the inner layer 302/reinforcement layer 306/outer layer 308) may be cured by, for example, applying heat and pressure to the multilayer hose. Application of heat and pressure during step 450 typically covalently bonds the inner layer 302 to the outer layer 308 into the core hose structure.

In accordance with some embodiments of the present invention, the multilayer hose may be provided in the method 400 simply by acquiring a conventional multilayer hose from a supplier in lieu of steps 410-450.

The method 400 continues by immersing the multilayer hose in a hydrophobic coating solution containing hydrophobizing monomers (or fluoropolymers) dissolved in a solvent (step 460). For example, hydroxyl-terminated PDMS may be dissolved in acetone (to just below saturation) to form a PDMS solution, into which is immersed the multilayer hose during step 460. Immersion is utilized in step 460 as an example of a suitable technique that may be employed to apply the hydrophobic coating solution to inside surface of the multilayer hose. One skilled in the art will appreciate that the hydrophobic coating solution may be applied to the inside surface of the multilayer hose by any suitable technique. For example, the hydrophobic coating solution may be passed through the multilayer hose.

The hydrophobic coating solution (e.g., the PDMS solution) may be at room temperature as the multilayer hose is immersed therein during step 460. It may be desirable, however, to heat the hydrophobic coating solution (e.g. the PDMS solution) to an elevated temperature (e.g., typically, less than 50° C.) as the multilayer hose is immersed therein during step 460.

The method 400 continues by drying the multilayer hose coated with the hydrophobic coating solution (e.g., the PDMS solution) to evaporate the solvent and thereby form the hydrophobic material coated multilayer hose (step 470). As the solvent evaporates, the siloxane monomers (or fluoropolymers) bind together to form the hydrophobic coating. Exemplary hydrophobic coatings include, but are not limited to, polydialkylsiloxanes such as polydimethylsiloxanes and fluoropolymers such as formed from fluorinated acrylate oligomers. Siloxane is an organosilicon and will not absorb BTA. Fluoropolymers are polymers that contain one or more fluoroalkyl groups and also will not absorb BTA.

The method 400 continues by rinsing the hydrophobic material coated multilayer hose with deionized water (step 480). This prevents any trace amount of the hydrophobic coating solution (e.g., the PDMS solution) from fouling the cooling liquid.

Figure 5:
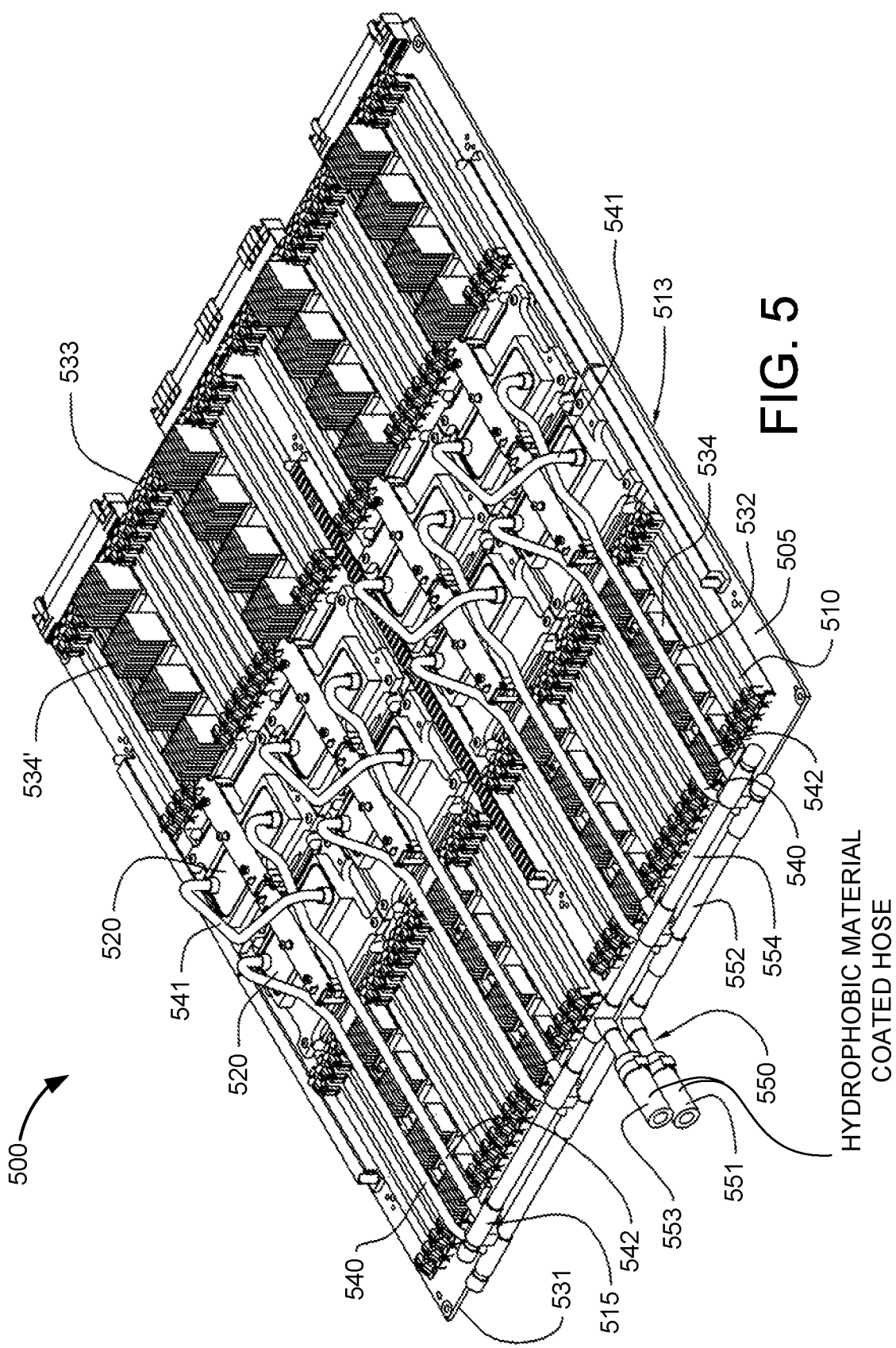
FIG. 5 is an isometric view of a partially assembled electronics drawer layout, wherein an electronic subsystem includes eight heat-generating electronic components to be actively cooled, each heat-generating electronic component having a respective liquid-cooled cold plate of a liquid-based cooling system coupled thereto, and each liquid-cooled cold plate is interconnected through coolant-carrying tubes and a header subassembly to coolant supply and return hoses each pre-treated with a hydrophobic coating according to some embodiments of the present invention.

FIG. 5 is an isometric view of a partially assembled electronics drawer layout 500, wherein an electronic subsystem includes eight heat-generating electronic components to be actively cooled, each heat-generating electronic component having a respective liquid-cooled cold plate of a liquid-based cooling system coupled thereto, and each liquid-cooled cold plate is interconnected through coolant-carrying tubes and a header subassembly to coolant supply and return hoses 551, 553 each pre-treated with a hydrophobic coating in accordance with some embodiments of the present invention. With the exception of the hydrophobic material coated hoses 551, 553, the electronics drawer layout 500 shown in FIG. 5 is conventional. Specifically, the electronics drawer layout 500 is a modified-version of the electronics drawer layout disclosed in U.S. Patent Application Publication 2012/0118534 A1, published May 17, 2012, entitled "MULTIMODAL COOLING APPARATUS FOR AN ELECTRONIC SYSTEM", assigned to the same assignee as the present application, now U.S. Pat. No. 8,514,575 B2, and hereby incorporated herein by reference in its entirety.

More particularly, FIG. 5 depicts a partially assembled electronic subsystem 513 and an assembled liquid-based cooling system 515 coupled to primary heat generating components (e.g., including processor dies) to be cooled. In this embodiment, the electronic subsystem is configured for (or as) an electronics drawer of an electronics rack, and includes, by way of example, a support substrate or planar board 505, a plurality of memory module sockets 510 (with the memory modules (e.g., dual in-line memory modules) not shown), multiple rows of memory support modules 532 (each having coupled thereto an air-cooled heat sink 534), and multiple processor modules (not shown) disposed below the liquid-cooled cold plates 520 of the liquid-based cooling system 515.

Liquid-based cooling system 515 comprises (in this embodiment) a preconfigured monolithic structure which includes multiple (pre-assembled) liquid-cooled cold plates 520 configured and disposed in spaced relation to engage respective heat generating electronic components. Each liquid-cooled cold plate 520 includes, in this embodiment, a coolant inlet and a coolant outlet, as well as an attachment subassembly (i.e., cold plate/load arm assembly). Each attachment subassembly is employed to couple its respective liquid-cooled cold plate 520 to the associated electronic component to form the cold plate and electronic component assemblies.

In addition to liquid-cooled cold plates 520, liquid-based cooling system 515 includes multiple coolant-carrying tubes, including coolant supply tubes 540 and coolant return tubes 542 in fluid communication with respective liquid-cooled cold plates 520. The coolant-carrying tubes 540, 542 are also connected to a header (or manifold) subassembly 550 which facilitates distribution of liquid coolant to the coolant supply tubes 540 and return of liquid coolant from the coolant return tubes 542. In this embodiment, the air-cooled heat sinks 534 coupled to memory support modules 532 positioned closer to the front 531 of electronics drawer 513 are shorter in height than the air-cooled heat sinks 534' coupled to memory support modules 532 positioned nearer to the back 533 of electronics drawer 513. This size difference is to accommodate the coolant-carrying tubes 540, 542 since, in this embodiment, the header subassembly 550 is at the front of the electronics drawer and the multiple liquid-cooled cold plates 520 are in the middle of the drawer.

In addition to coolant supply tubes 540 and coolant return tubes 542, in this embodiment, bridge tubes or lines 541 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 540, bridge tubes 541 and coolant return tubes 542 are each preconfigured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are preconfigured for a particular electronic subsystem to facilitate installation of the monolithic structure in engaging relation with the electronic subsystem.

As shown in FIG. 5, header subassembly 550 includes two liquid manifolds, i.e., a coolant supply header 552 and a coolant return header 554, which in one embodiment, are coupled together via supporting brackets. In the monolithic cooling structure of FIG. 5, the coolant supply header 552 is metallurgically bonded and in fluid communication to each coolant supply tube 540, while the coolant return header 554 is metallurgically bonded and in fluid communication to each coolant return tube 542. A single coolant inlet and a single coolant outlet extend from the header subassembly for coupling through hydrophobic material coated hoses 551, 553 (coolant supply and return, respectively) to the electronic rack's coolant supply and return manifolds 632, 631 (shown in FIG. 6). The hydrophobic material coated hoses 551, 553 shown in FIGS. 5 and 6 may correspond with the hydrophobic material coated multilayer hose 300 shown in FIG. 3.

Figure 6:
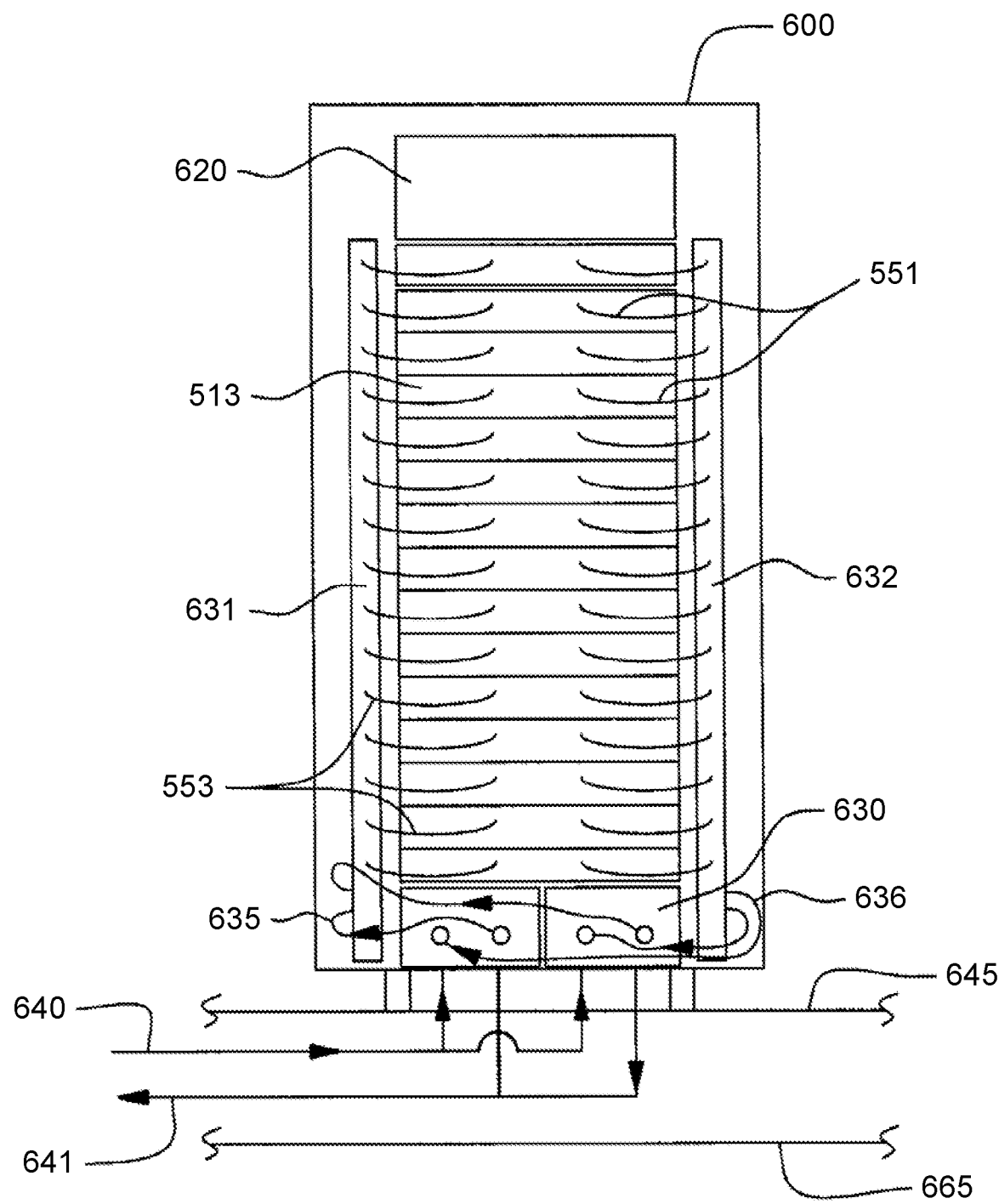
FIG. 6 is a front elevational view of a liquid-cooled electronics rack comprising multiple electronic subsystems of FIG. 5, wherein coolant supply and return headers and coolant supply and return manifolds are interconnected through coolant supply and return hoses each pre-treated with a hydrophobic coating according to some embodiments of the present invention.

FIG. 6 is a front elevational view of a liquid-cooled electronics rack 600 comprising multiple electronic subsystems of FIG. 5, wherein coolant supply and return headers and coolant supply and return manifolds are interconnected through coolant supply and return hoses 551, 553 each pre-treated with a hydrophobic coating in accordance with some embodiments of the present invention. In this embodiment, the liquid-cooled electronics rack 600 comprises a plurality of electronic subsystems 513, which are (in one embodiment) processor or server nodes. A bulk power regulator 620 is shown disposed at an upper portion of the liquid-cooled electronics rack 600, and two modular cooling units (MCUs) 630 are disposed in a lower portion of the liquid-cooled electronics rack. In the embodiment described below, the coolant is assumed to be water or an aqueous-based solution, again, by way of example.

In addition to MCUs 630, the cooling apparatus includes a system water supply manifold 631, a system water return manifold 632, and manifold-to-node fluid connect hydrophobic material coated hoses 553 coupling system water supply manifold 631 to electronic subsystems 513, and node-to-manifold fluid connect hydrophobic material coated hoses 551 coupling the individual electronic subsystems 513 to the system water return manifold 632. Each MCU 630 is in fluid communication with system water supply manifold 631 via a respective system water supply hose 635, and each MCU 630 is in fluid communication with system water return manifold 632 via a respective system water return hose 636. The system water supply hose 635 and/or the system water return hose 636 may be hydrophobic material coated hoses.

As illustrated, heat load of the electronic subsystems is transferred (via a liquid-to-liquid heat exchanger (not shown) in each of the MCUs 630) from the system water to cooler facility water supplied by facility water supply line 640 and facility water return line 641 disposed, in the illustrated embodiment, in the space between a raised floor 645 and a base floor 665.

One skilled in the art will appreciate that many variations are possible within the scope of the present invention. For example, the hydrophobic material coated hose in accordance with some embodiments of the present invention may be utilized in other applications, such as applications in the automotive industry (for applications such as interconnecting components for engine cooling) and other industries. Thus, while the present invention has been particularly shown and described with reference to particular embodiments thereof, it will be understood by those skilled in the art that these and other changes in form and detail may be made therein without departing from the spirit and scope of the present invention.

What is claimed is:

1. A method of fabricating a hydrophobic material coated hose for interconnecting components of a liquid-coolant cooling system having a corrosion inhibitor dissolved in a liquid coolant, comprising the steps of:
   providing a hose, wherein the hose comprises polymer tubing containing oxide surfaces;
   immersing the hose in a hydrophobic coating solution containing a fluoropolymer dissolved in a solvent to coat the hose with the solution;
   drying the hose coated with the solution to evaporate the solvent and form a fluoropolymer hydrophobic coating on an inside surface of the hose, wherein the fluoropolymer hydrophobic coating has a coating thickness suitable to reduce depletion of the corrosion inhibitor dissolved in the liquid coolant by the oxide surfaces contained in the polymer tubing, wherein the coating thickness is 1-5 mils, wherein the fluoropolymer hydrophobic coating is formed by binding together the fluoropolymers and by binding the fluoropolymer to the oxide surfaces contained in the polymer tubing, and wherein the hydrophobic coating solution includes one or more fluoroethylene/vinyl ether (FEVE) copolymers as the fluoropolymer.

2. The method as recited in claim 1, wherein the solvent includes xylene.

3. The method as recited in claim 1, wherein the corrosion inhibitor includes benzotriazole (BTA).

4. The method as recited in claim 1, wherein the corrosion inhibitor includes benzotriazole (BTA), wherein the hose is a multilayer hose comprising an inner layer and outer layer each comprised of ethylene propylene diene monomer (M-class) (EPDM) rubber, wherein a reinforcement layer is interposed between the inner layer and the outer layer, and wherein the reinforcement layer comprises textile filaments braided, knitted or spirally wound on the inner layer.

5. A method of fabricating a hydrophobic material coated hose for interconnecting components of a liquid-coolant cooling system having a corrosion inhibitor dissolved in a liquid coolant, comprising the steps of:
   providing a hose, wherein the hose comprises polymer tubing containing oxide surfaces;
   immersing the hose in a hydrophobic coating solution containing a fluoropolymer dissolved in a solvent to coat the hose with the solution;
   drying the hose coated with the solution to evaporate the solvent and form a fluoropolymer hydrophobic coating on an inside surface of the hose, wherein the fluoropolymer hydrophobic coating has a coating thickness suitable to reduce depletion of the corrosion inhibitor dissolved in the liquid coolant by the oxide surfaces contained in the polymer tubing, wherein the coating thickness is 1-5 mils, wherein the fluoropolymer hydrophobic coating is formed by binding together the fluoropolymer and by binding the fluoropolymer to the oxide surfaces contained in the polymer tubing, and wherein the hydrophobic coating solution includes one or more fluorinated acrylate oligomers as the fluoropolymer.

6. The method as recited in claim 5, wherein the corrosion inhibitor includes benzotriazole (BTA).

7. The method as recited in claim 5, wherein the corrosion inhibitor includes benzotriazole (BTA), wherein the hose is a multilayer hose comprising an inner layer and outer layer each comprised of ethylene propylene diene monomer (M-class) (EPDM) rubber, wherein a reinforcement layer is interposed between the inner layer and the outer layer, and wherein the reinforcement layer comprises textile filaments braided, knitted or spirally wound on the inner layer.

8. A method of fabricating a hydrophobic material coated hose for interconnecting components of a liquid-coolant cooling system having a corrosion inhibitor dissolved in a liquid coolant, comprising the steps of:
   providing a hose, wherein the hose comprises polymer tubing containing oxide surfaces;
   immersing the hose in a hydrophobic coating solution containing a hydrophobizing siloxane monomer or a fluoropolymer dissolved in a solvent to coat the hose with the solution;
   drying the hose coated with the solution to evaporate the solvent and form a hydrophobic coating on an inside surface of the hose, wherein the hydrophobic coating has a coating thickness suitable to reduce depletion of the corrosion inhibitor dissolved in the liquid coolant by the oxide surfaces contained in the polymer tubing, wherein the coating thickness is 1-5 mils, wherein the hydrophobic coating is formed by binding together the hydrophobizing siloxane monomers or the fluoropolymers and by binding the hydrophobizing siloxane monomers or the fluoropolymers to the oxide surfaces contained in the polymer tubing.

9. The method as recited in claim 8, wherein the hydrophobic coating solution includes a polydialkylsiloxane as the hydrophobizing siloxane monomer.

10. The method as recited in claim 9, wherein the polydialkylsiloxane is a hydroxyl-terminated polydimethylsiloxane (PDMS), and wherein the terminal hydroxyl groups of the hydroxyl-terminated PDMS are available to participate in a condensation reaction with each other to form the hydrophobic coating.

11. The method as recited in claim 10, wherein the solvent includes acetone.

12. The method as recited in claim 8, wherein the hydrophobic coating solution includes a fluoroethylene/vinyl ether (FEVE) copolymer as the fluoropolymer.

13. The method as recited in claim 12, wherein the solvent includes xylene.

14. The method as recited in claim 8, wherein the corrosion inhibitor includes benzotriazole (BTA), wherein the hose is a multilayer hose comprising an inner layer and outer layer each comprised of ethylene propylene diene monomer (M-class) (EPDM) rubber, wherein a reinforcement layer is interposed between the inner layer and the outer layer, and wherein the reinforcement layer comprises textile filaments braided, knitted or spirally wound on the inner layer.

* * * * *